United States Patent
Maeda

(10) Patent No.: US 10,564,848 B2
(45) Date of Patent: Feb. 18, 2020

(54) INFORMATION STORAGE DEVICE AND METHOD FOR DEDUPLICATION

(71) Applicant: FUJITSU LIMITED, Kawasaki-shi, Kanagawa (JP)

(72) Inventor: Munenori Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/472,616

(22) Filed: Mar. 29, 2017

(65) Prior Publication Data

US 2017/0300235 A1 Oct. 19, 2017

(30) Foreign Application Priority Data

Apr. 13, 2016 (JP) .................................. 2016-080194

(51) Int. Cl.
*G06F 3/06* (2006.01)
*G11C 16/10* (2006.01)
*H03M 7/48* (2006.01)

(52) U.S. Cl.
CPC .......... *G06F 3/0608* (2013.01); *G06F 3/0641* (2013.01); *G06F 3/0659* (2013.01);
(Continued)

(58) Field of Classification Search
CPC ......... H03M 7/46; H03M 7/48; G06F 3/0641; G06F 3/0659; G06F 3/0679; G06F 3/0608; G11C 16/10; G11C 7/1006
See application file for complete search history.

(56) References Cited

U.S. PATENT DOCUMENTS

| | | | | |
|---|---|---|---|---|
| 4,533,957 A | * | 8/1985 | Iinuma | G06T 9/005 |
| | | | | 358/426.12 |
| 5,179,711 A | * | 1/1993 | Vreeland | G06F 7/02 |
| | | | | 341/59 |

(Continued)

FOREIGN PATENT DOCUMENTS

| | | |
|---|---|---|
| JP | 10-301937 | 11/1998 |
| JP | 2002-281411 | 9/2002 |

(Continued)

OTHER PUBLICATIONS

An overhead-reduced and improved Run-Length-Encoding Method by Mespotine (Year: 2015).*

(Continued)

*Primary Examiner* — Paul M Knight
(74) *Attorney, Agent, or Firm* — Staas & Halsey LLP

(57) ABSTRACT

An information storage device includes a memory and a processor coupled to the memory. The memory is configured to store therein a plurality of data. The processor is configured to receive a write request of writing first data to the memory. The processor is configured to perform an exclusive OR operation on the first data and second data of the plurality of data to obtain first difference data. The processor is configured to encode the first difference data by a run-length encoding to obtain encoded data. The processor is configured to determine whether a first size of the encoded data is smaller than a predetermined threshold value. The processor is configured to store, upon determining that the first size is smaller than the predetermined threshold value, the encoded data in the memory in association with first position information indicating a position of the second data.

6 Claims, 11 Drawing Sheets

(52) U.S. Cl.
CPC ............ *G06F 3/0679* (2013.01); *G11C 16/10* (2013.01); *H03M 7/48* (2013.01)

(56) References Cited

U.S. PATENT DOCUMENTS

| | | | | |
|---|---|---|---|---|
| 5,873,112 | A * | 2/1999 | Norman | G11C 16/10 257/E27.103 |
| 6,304,928 | B1 * | 10/2001 | Mairs | G06F 3/1462 345/555 |
| 6,661,839 | B1 * | 12/2003 | Ishida | G01R 31/31921 341/51 |
| 7,730,347 | B1 * | 6/2010 | Yang | G06F 11/1076 714/15 |
| 8,239,706 | B1 * | 8/2012 | Yang | G06F 11/1076 714/15 |
| 2002/0131505 | A1 * | 9/2002 | Vidunas | H04N 19/63 375/240.19 |
| 2006/0271534 | A1 | 11/2006 | Hamaguchi et al. | |
| 2008/0123783 | A1 * | 5/2008 | Yoshida | H04L 25/03866 375/342 |
| 2009/0193213 | A1 * | 7/2009 | Winter | H03M 7/30 711/165 |
| 2011/0083054 | A1 * | 4/2011 | Ozdemir | G11B 20/1403 714/752 |
| 2012/0170678 | A1 * | 7/2012 | Krachkovsky | H04L 1/0042 375/295 |
| 2013/0007511 | A1 * | 1/2013 | Gaertner | G06F 11/1662 714/6.22 |
| 2014/0119388 | A1 * | 5/2014 | Mendel | H03M 5/145 370/476 |
| 2014/0119486 | A1 * | 5/2014 | Mendel | H03M 5/145 375/353 |
| 2014/0223270 | A1 * | 8/2014 | Gauvin | G06F 11/08 714/824 |
| 2015/0194950 | A1 * | 7/2015 | Mahendra | H03K 3/356078 327/202 |
| 2016/0328154 | A1 | 11/2016 | Mizushima et al. | |

FOREIGN PATENT DOCUMENTS

| | | |
|---|---|---|
| JP | 2004-326636 | 11/2004 |
| JP | 2006-331014 | 12/2006 |
| WO | 2015/128955 | 9/2015 |

OTHER PUBLICATIONS

A Block-sorting Lossless Data Compression Algorithm by Burrows and Wheeler: Systems Research Center (Year: 1994).*

An Analysis of the Burrows—Wheeler Transform by Manzini; Universita del Piemonte Orientale, Alessandria, Italy (Year: 2001).*

Data Compression with the Burrows-Wheeler Transform by Nelson; Dr. Dobb's Journal (Year: 1996).*

Looking for a better compression technique; Stack Overflow (Year: 2012).*

Lossless Audio Coding based on Burrows Wheeler Transform and Run Length Encoding Algorithm by Warkade; SSRG International Journal of Electronics and Communication Engineering (SSRG-IJECE)—vol. 2 Issue 10—Oct. 2015 (Year: 2015).*

Notice of Reasons for Refusal, dated Nov. 26, 2019, in Japanese Application No. 2016-080194 (11 pp.).

* cited by examiner

US 10,564,848 B2

INFORMATION STORAGE DEVICE AND METHOD FOR DEDUPLICATION

CROSS-REFERENCE TO RELATED APPLICATION

This application is based upon and claims the benefit of priority of the prior Japanese Patent Application No. 2016-080194, filed on Apr. 13, 2016, the entire contents of which are incorporated herein by reference.

FIELD

The embodiments discussed herein are related to an information storage device and a method for deduplication.

BACKGROUND

In related arts, there is a deduplication technique (a technique that eliminates a duplication) which detects identical data among a plurality of data in a storage, leaves one master data among a plurality of identical data and removes other data, and manages data with a reference to the master data and the number of references to the master data.

As a related technique, for example, there is a technique in which related information to be provided is determined by excluding duplicated information of delivered information or highly likely duplicated information of delivered information, among candidate information which may be provided as related information. There is another technique in which, in search of a neighborhood case for similar reference cases, a search order is determined by sorting the reference cases. When the neighborhood case is to be searched for the first reference case, search cases existing near the first reference case are stored in a cache. Then the neighborhood case is searched for from among the stored search cases. Further, there is a technique in which a tree-structured index is sequentially traced from a root node by referring to management information when a reference point is input to update the management information. The management information stores therein a set of a pointer to a node of the tree-structured index and a distance evaluation value between the reference point and a point corresponding to the node in a multi-dimensional vector space.

Related techniques are disclosed in, for example, Japanese Laid-Open Patent Publication No. 2006-331014, Japanese Laid-Open Patent Publication No. 2004-326636 and Japanese Laid-Open Patent Publication No. 10-301937.

SUMMARY

According to an aspect of the present invention, provided is an information storage device including a memory and a processor coupled to the memory. The memory is configured to store therein a plurality of data. The processor is configured to receive a write request of writing first data to the memory. The processor is configured to perform an exclusive OR operation on the first data and second data of the plurality of data to obtain first difference data. The processor is configured to encode the first difference data by a run-length encoding to obtain encoded data. The processor is configured to determine whether a first size of the encoded data is smaller than a predetermined threshold value. The processor is configured to store, upon determining that the first size is smaller than the predetermined threshold value, the encoded data in the memory in association with first position information indicating a position of the second data.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In related arts, it is difficult to shorten a time taken to perform a process of removing similar data by considering it as duplicated among a plurality of data while ensuring accuracy in determining the similar data. For example, as a method for determining whether data is similar data at a high speed, it may be suggested that certain data among a plurality of data and new data are considered as numerical values and a value obtained by arithmetic subtraction between the certain data and the new data is used to determine whether the data is similar. However, in this case, a slight difference of a most significant bit (MSB) significantly affects the result of the arithmetic subtraction so that the accuracy in determining similar data is deteriorated.

Hereinafter, embodiments of an information storage device and a method for deduplication will be described in detail with reference to the drawings.

Figure 1:
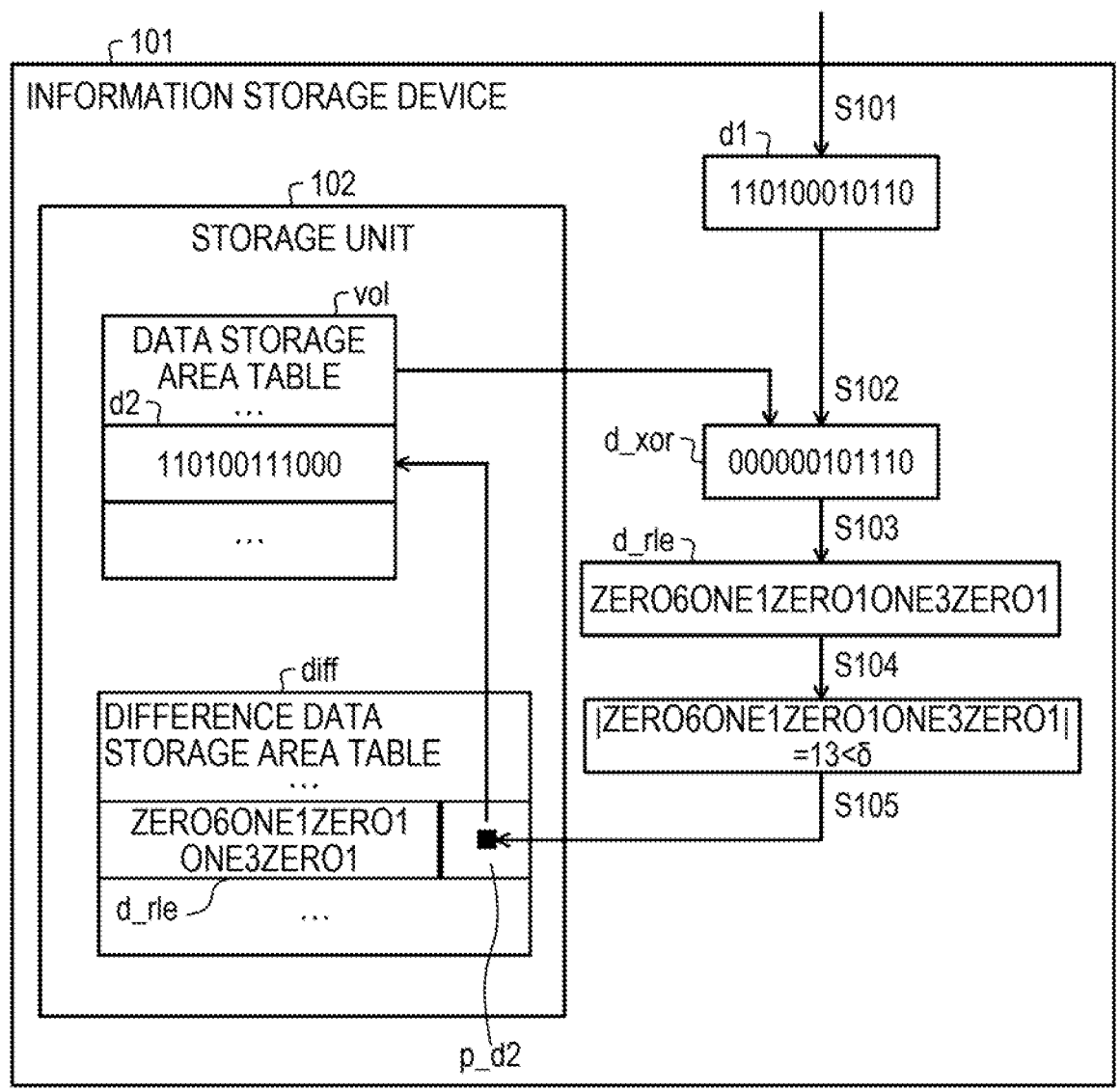
FIG. 1 is a diagram illustrating an exemplary operation of an information storage device.

FIG. 1 is a diagram illustrating an exemplary operation of an information storage device 101 according to the embodiments. The information storage device 101 is, for example, a computer which stores therein data. The recent increase in big data exceeds the growth rate of a storage capacity, and the data deduplication and compression techniques improve the usage efficiency of a storage.

The deduplication technique is a technique which detects identical data among a plurality of data in a storage, leaves one master data among a plurality of identical data and removes other data, and manages data with a reference to the master data and the number of references to the master data.

Here, when the condition of the "identical data" in the deduplication technique is alleviated to "similar data", and a reference to the master data and a difference from the master data are managed, more duplicated places may be detected due to the alleviation of the condition, as compared to detecting the identical data. The usage efficiency of the storage may be improved further by detecting more duplicated places.

For a storage application, when a backup or a snapshot is created, a copy-on-write process is performed in which copy is delayed until data is written. In the copy-on-write process, when a unit of data management is large, there occurs a phenomenon that contents only in some continuous parts of original data d and written data d' are different from each other. That is, a bitwise difference between d and d' may be localized for a storage application. Thus, it is required that the difference may be small, that d' may be restored at a high speed from the difference and d, and that the degree of similarity may be easily calculated.

As a specific numerical value, the size ratio of the difference to the written data needs to be increased to some extent in order to improve the usage efficiency of the storage. For example, when the data size is 4 KiB, a bit length is 32 K. When a storage capacity of the storage is 1 TiB, 1 TiB/4 KiB=$2^{28}$ data exist. When it is assumed that every data has, for example, eight similar data including itself, there exist $2^{25}$ in total, approximately 33 million master data. When new data is added, calculation of the degree of similarity and difference have to be performed by comparing 32 K bits of each of existing approximately 33 million master data to the new data. Thus, it is required to easily calculate the degree of similarity and difference.

However, it is difficult to shorten a time taken to perform a process of removing similar data by considering it as duplicated while maintaining an accuracy in determining the similar data. For example, as a method for determining whether data is similar data at a high speed, it may be suggested that certain data d among a plurality of stored data and new data d' are considered as numerical values and a value obtained by arithmetic subtraction between the certain data d and the new data d' is used to determine whether the data is similar. In this case, when the different bits are concentrated on the least significant bit (LSB) side, it is determined that the data is similar. Meanwhile, a few different bits on the MSB side significantly affect the result of the arithmetic subtraction and the data is to be determined not to be similar, so that the accuracy in determining similar data is deteriorated. In a storage application, especially, in the copy-on-write process, it is not expected that the difference bits are biased to the LSB side.

When similar data is detected, the difference is managed. However, in this case, it is required to make the data size of the difference to be smaller than the data size of the data d'. This is because when the data size of the difference is larger than the data size of the data d', it is more advantageous when the data d' is stored as it is without taking the difference. For example, it may be considered that d and d' are interpreted as bit strings. The degree of similarity is defined as a hamming distance of d and d'. The difference is defined as a set of positions of different bits in a bitwise comparison of d and d'. In this case, data in the same hamming distance is determined to have the same degree of similarity, but the data size of the difference may become larger than the data size of d' in some cases.

Therefore, according to the embodiments, descriptions will be made on a method in which run-length encoding (RLE) is performed on an exclusive OR of d and d' to obtain encoded data, and position information of d and the encoded data are stored in association with each other when a size of the encoded data is smaller than a predetermined threshold value. Specifically, in the embodiments, when Expression 1 is satisfied, d and d' are considered to be similar.

$$\text{size}(\text{RLE}(\text{xor}(d,d')))<\delta \qquad (1)$$

Here, d and d' are fixed-length binary data with the same size. The operation xor( ) is an operation of performing bitwise exclusive OR. The operation RLE( ) is an operation of performing the run-length encoding. The operation size ( ) is an operation of calculating a bit length. The symbol δ is a predetermined threshold value to determine whether the data is similar. The value of δ is a positive integer. The value of δ is set in advance by an administrator of the information storage device 101 in consideration of the size of d.

The operations xor( ), RLE( ), and size( ) will be described in more detail. The operation xor(d, d') is an operation of calculating a difference between d and d'. A value obtained by xor(d, d') has a fixed length size which is the same as d and d'. When d and d' have the same contents, xor(d, d') is 00 . . . 0. In a bitwise observation, the value obtained by xor(d, d') is 0 when the corresponding bits of d and d' have the same value, and 1 when the corresponding bits of d and d' have different values.

The operation RLE( ) is an operation of performing the run-length encoding. An output result of the RLE( ) is data in which a set of a bit indicating whether the data is 0 or 1 and a numerical value indicating how many bits are continued is repeated. For example, when data in which 0 is consecutively arranged N times is input, the output result is represented as "0N". When data in which 1 is consecutively arranged N times is input, the output result is represented as "1N". Hereinafter, in order to distinguish a bit indicating whether the data is 0 or 1 from the numerical value indicating how many bits are continued, a bit indicating 0 is denoted by "zero" and a bit indicating 1 is denoted by "one".

For example, when data in which 0 is consecutively arranged N times is input, the output result is denoted by "zeroN". The data length of the output result is a numerical value obtained by rounding up (1+log(N)) to the nearest whole number. Here, log( ) is a logarithm with 2 as a base. That is, "zero" is represented by one bit, and when N is denoted by a binary number, the binary number is represented with bits of a data length corresponding to a numerical value obtained by rounding up log(N) to the nearest whole number. For example, when N is 3, a data length of "zero3" is 3.

The operation size( ) is an operation of calculating a length of a code. For example, size(zeroN)=a numerical value obtained by rounding up 1+log(N) to the nearest whole number. Thus, Expression 1 may be represented by a sentence that "information amount of the difference information is smaller than a given predetermined threshold value δ". Exemplary calculations of a degree of similarity will be described. In the following description, size( ) is denoted by "||".

|RLE(xor(000,111))|=|RLE(111)|=|one3|=3

|RLE(xor(000,000))|=|RLE(000)|=|zero3|=3

|RLE(xor(010,101))|=|RLE(111)|=|one3|=3

|RLE(xor(000,001))|=|RLE(001)|=|zero2one1|=5

As a characteristic of the degree of similarity according to the embodiments, it is determined that the degree of similarity is high when the bitwise difference is locally concentrated. Further, there is a characteristic that the degree of similarity of d and d' is the same as the degree of similarity of d and data (hereinafter, referred to as bit-inverted d')

obtained by performing a full-bit inversion on d'. Here, the full-bit inversion indicates an operation of inverting every bit of binary data. The characteristic will be described in detail with reference to FIG. 8.

Figure 5:
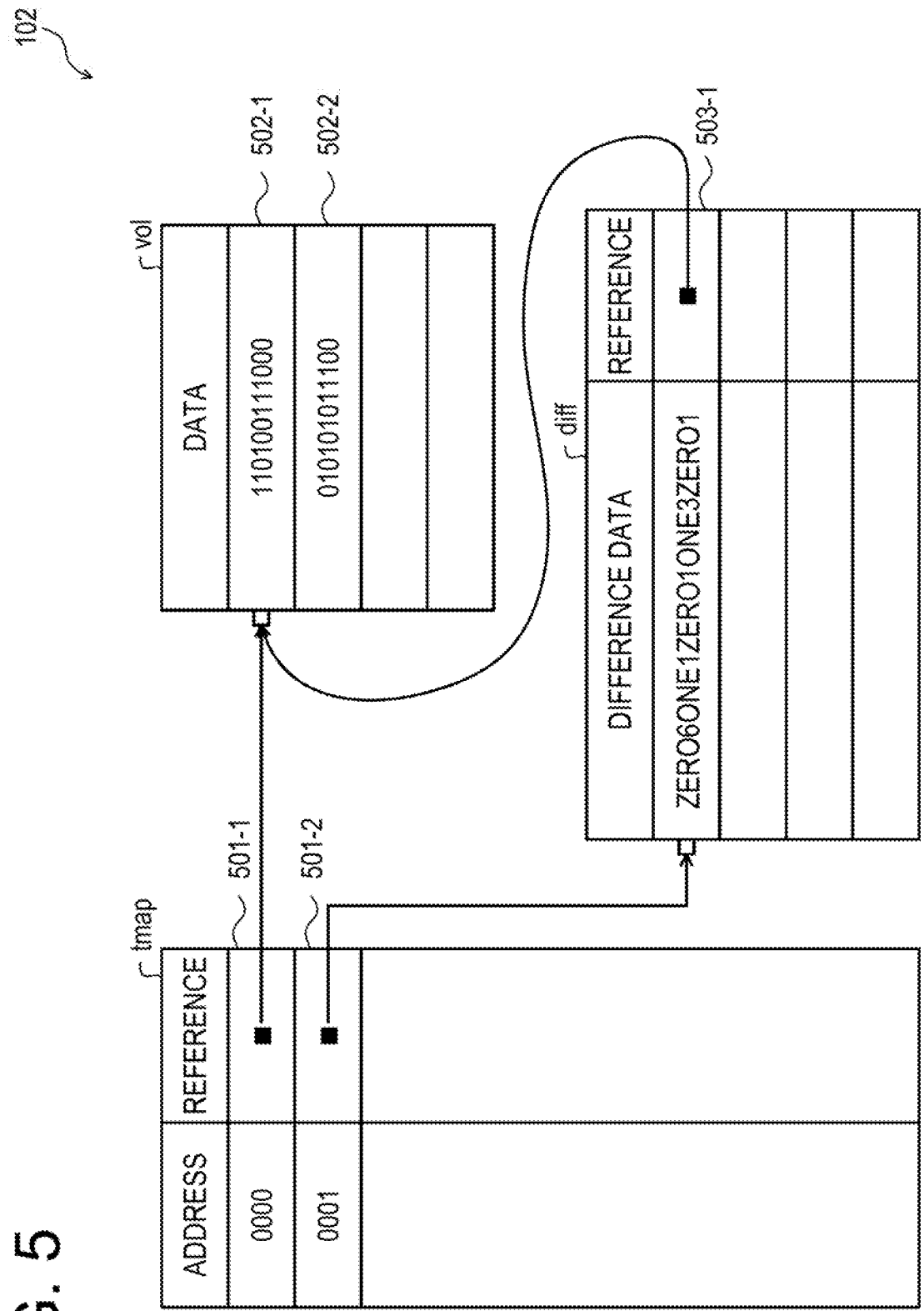
FIG. 5 is a diagram illustrating an example of stored contents of a storage unit.

Next, an exemplary operation of the information storage device 101 employing the degree of similarity according to the embodiments will be described with reference to FIG. 1. First, the information storage device 101 includes a storage unit 102 which stores therein a plurality of data. More specifically, the storage unit 102 has a data storage area table vol and the plurality of data is included in the data storage area table vol. An example of stored contents of the data storage area table vol is illustrated in FIG. 5.

The information storage device 101 receives a write request of writing data d1 as first data to a storage unit 102 from an apparatus which uses the information storage device 101 (S101). The data d1 illustrated in FIG. 1 is "110100010110".

Next, the information storage device 101 calculates an exclusive OR of the data d1 and data d2 as second data which is any one of the plurality of data included in the data storage area table vol (S102). In the example of FIG. 1, the data d2 is "110100111000". Therefore, the information storage device 101 may obtain data d_xor by calculating the exclusive OR of the data d2 and the data d1. The data d_xor is "000000101110".

The information storage device 101 encodes the data d_xor by the run-length encoding and obtains encoded data d_rle (S103). The encoded data d_rle is "zero6one1zero1one3zero1".

Next, the information storage device 101 determines whether the size of the encoded data d_rle is smaller than a predetermined threshold value δ (S104). As illustrated in FIG. 1, the size of the encoded data d_rle is 13, and the information storage device 101 determines whether 13 is smaller than the predetermined threshold value δ.

In the example of FIG. 1, it is assumed that 13 is smaller than the predetermined threshold value δ. In this case, the information storage device 101 stores information p_d2 representing a position of data d2 in association with the encoded data d_rle in the storage unit 102 (S105). More specifically, the information storage device 101 stores the information p_d2 representing the position of data d2 in association with the encoded data d_rle in a difference data storage area table diff included in the storage unit 102. An example of stored contents of the difference data storage area table diff will be described later with reference to FIG. 5. The information p_d2 may be, for example, an index number of the data d2 in the data storage area table vol or a value of logical block addressing (LBA) at which the data d2 is stored.

When 13 is equal to or larger than the predetermined threshold value δ, the information storage device 101 performs S102 to 105 illustrated in FIG. 1 on the data d1 and data, which is different from data d2, as second data which is any one of the plurality of data included in the data storage area table vol.

As described above, since the size of the encoded data, which indicates the size of the difference, is obtained at a high speed, the information storage device 101 may perform deduplication of similar data at a high speed. Since the size of the run-length encoding data of the exclusive OR is used for the degree of similarity, it is determined that degree of similarity of data in which logics of 0 and 1 are almost opposite to each other is high. As a result, the information storage device 101 may improve the degree of duplication.

Next, an exemplary configuration of the system in which the information storage device 101 is included will be described with reference to FIG. 2.

Figure 2:
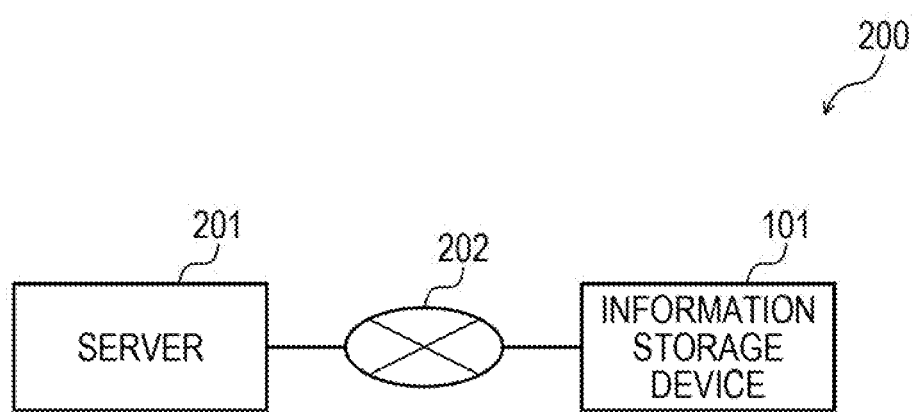
FIG. 2 is a diagram illustrating an exemplary configuration of a storage system.

FIG. 2 is a diagram illustrating an exemplary configuration of a storage system 200. The storage system 200 includes the information storage device 101 and a server 201. The information storage device 101 and the server 201 are coupled to each other by a network 202 such as a local area network (LAN) or a wide area network (WAN).

The server 201 is a computer serving as a host which uses the information storage device 101. The server 201 is, for example, a web server or an application server. Next, a hardware configuration of the information storage device 101 will be described with reference to FIG. 3.

Figure 3:
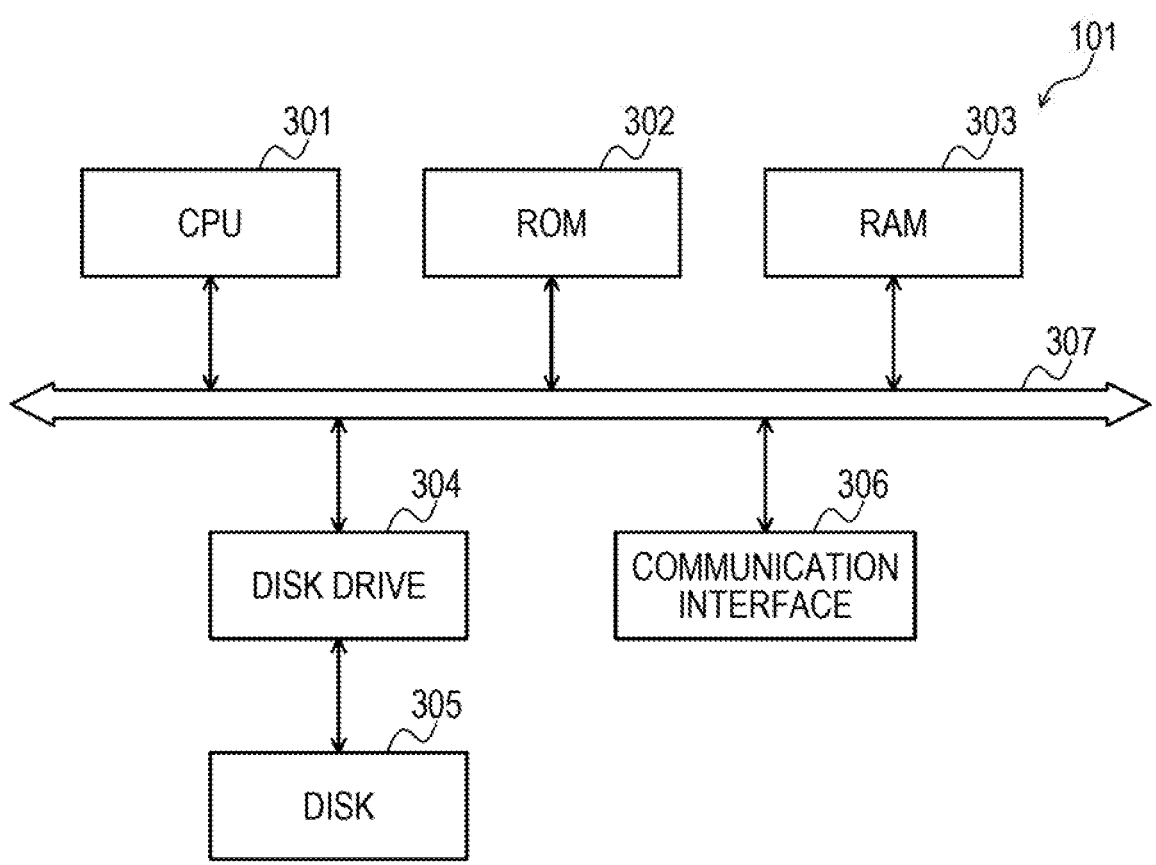
FIG. 3 is a diagram illustrating an exemplary hardware configuration of an information storage device.

FIG. 3 is a diagram illustrating an exemplary hardware configuration of the information storage device 101. As illustrated in FIG. 3, the information storage device 101 includes a central processing unit (CPU) 301, a read-only memory (ROM) 302, and a random access memory (RAM) 303. The information storage device 101 also includes a disk drive 304, a disk 305, and a communication interface 306. The CPU 301 to the disk drive 304 and the communication interface 306 are coupled to each other by a bus 307.

The CPU 301 is an arithmetic processing device which entirely controls the information storage device 101. The ROM 302 is a non-volatile memory which stores therein a program such as a boot program. The RAM 303 is a volatile memory which is used as a work area of the CPU 301.

The disk drive 304 is a control device to control data to be read/written from/onto the disk 305 under the control of the CPU 301. As the disk drive 304, for example, a magnetic disk drive, an optical disk drive, a solid state drive, or the like may be employed. The disk 305 is a non-volatile memory which stores therein data written by the control of the disk drive 304. For example, when the disk drive 304 is a magnetic disk drive, a magnetic disk may be employed as the disk 305. When the disk drive 304 is an optical disk drive, an optical disk may be employed as the disk 305. When the disk drive 304 is a solid state drive, a semiconductor memory which is formed of a semiconductor device, that is, a so-called semiconductor disk, may be employed as the disk 305.

The communication interface 306 is a control device which serves as an interface between the network 202 and the inside, and controls the data to be input/output from/to another device. Specifically, the communication interface 306 is coupled to another device via the network 202 through a communication line. As the communication interface 306, for example, a modem, a LAN adaptor, or the like may be employed.

When the administrator of the information storage device 101 directly manipulates the information storage device 101, the information storage device 101 may include hardware such as a display, a keyboard, and a mouse. The server 201 also has a similar hardware configuration to that of the information storage device 101.

Figure 4:
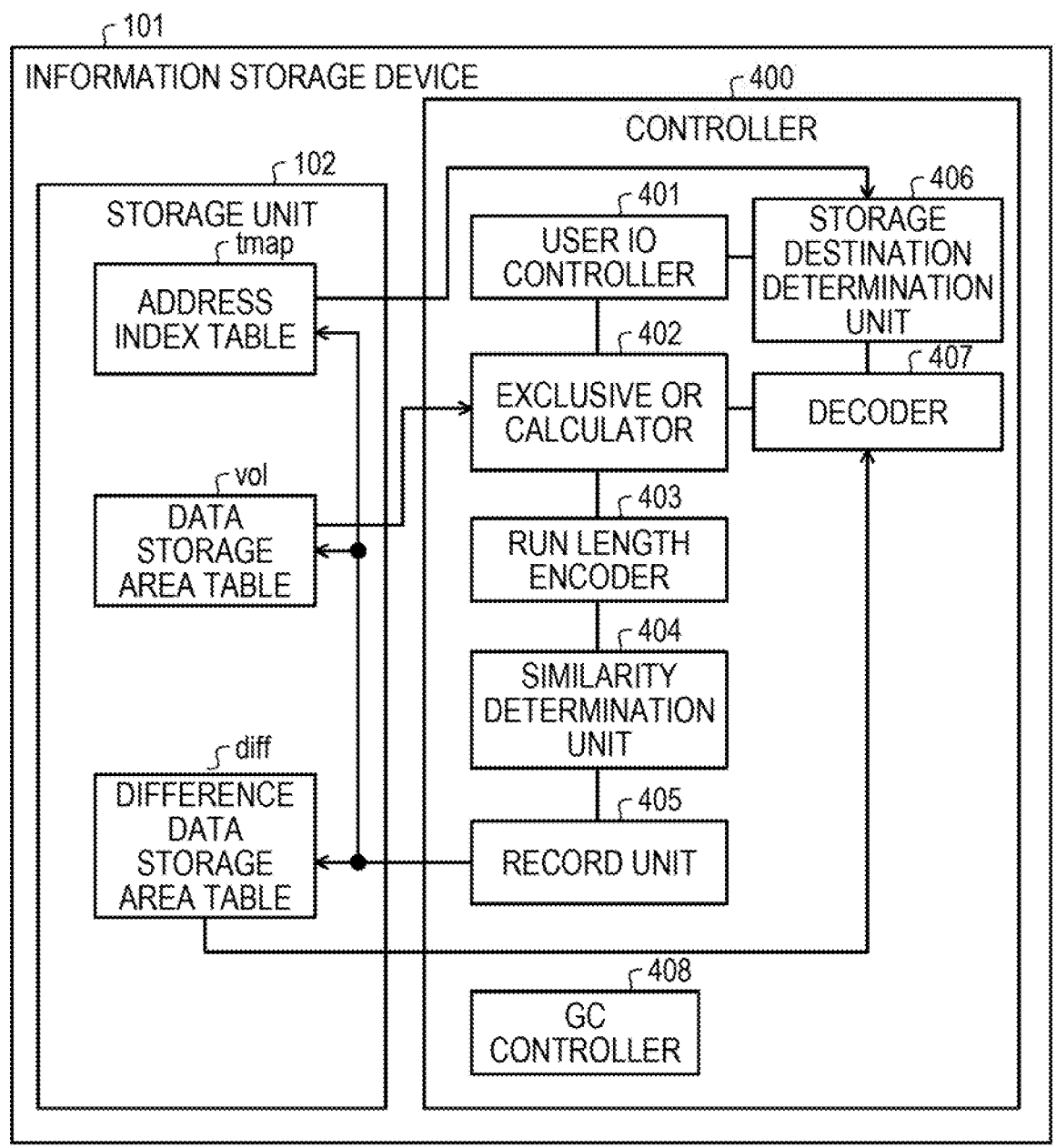
FIG. 4 is a diagram illustrating an exemplary functional configuration of an information storage device.

FIG. 4 is a diagram illustrating an exemplary functional configuration of the information storage device 101. The information storage device 101 includes a controller 400. The controller 400 includes a user input/output (IO) controller 401, an exclusive OR calculator 402, a run-length encoder 403, a similarity determination unit 404, a record unit 405, a storage destination determination unit 406, a decoder 407, and a garbage collection (GC) controller 408. By executing the program stored in the storage device, the CPU 301 performs the functions of the individual units included in the controller 400. The storage device is, for example, the ROM 302, the RAM 303, the disk 305, or the like illustrated in FIG. 3. The processing results of the individual units are stored in a register of the CPU 301, a cache memory of the CPU 301, the RAM 303, or the like.

The information storage device 101 is accessible to the storage unit 102. The storage unit 102 is implemented by the storage device such as the RAM 303 and the disk 305. The storage unit 102 has the data storage area table vol, the difference data storage area table diff, and an address index table tmap. The data storage area table vol stores therein a plurality of data. The difference data storage area table diff stores therein encoded data of an exclusive OR of one of the plurality of data stored in the data storage area table vol and data which is similar to the data, in association with information indicating a position of the data. The address index table tmap stores information indicating a position of one of the plurality of data stored in the data storage area table vol or a position of encoded data stored in the difference data storage area table diff, in association with an address recognized by the server 201. Examples of stored contents of the address index table tmap, the data storage area table vol, and the difference data storage area table diff will be described later with reference to FIG. 5.

The user IO controller 401 receives, from the server 201, an IO request for reading data, writing data, or the like. After processing in response to the IO request is completed, the user IO controller 401 transmits, to the server 201, a response to the request.

A process when a write request is received from the server 201 will be described. The user IO controller 401 receives a write request (first data write request) of writing first data in the storage unit 102. The write request of writing the first data includes an address of a write destination of the first data, and the first data. As a procedure at the time of writing the data, according to the embodiments, there are a method according to a first embodiment and a method according to a second embodiment. First, functions of individual units for the method according to the first embodiment in the writing will be described.

When the first data write request is received, the exclusive OR calculator 402 calculates an exclusive OR of the first data and second data which is one of the plurality of data.

The run-length encoder 403 encodes the exclusive OR calculated by the exclusive OR calculator 402 by the run-length encoding.

The similarity determination unit 404 determines whether a size of the encoded data which is encoded by the run-length encoder 403 is smaller than a predetermined threshold value δ.

When the similarity determination unit 404 determines that the size of the encoded data is smaller than the predetermined threshold value δ, the record unit 405 stores the encoded data and information indicating a position of the second data in association with each other in the difference data storage area table diff.

When the similarity determination unit 404 determines that the size of the encoded data is smaller than the predetermined threshold value, the record unit 405 also stores information indicating an address included in the write request and a position of the encoded data in association with each other in the address index table tmap.

The exclusive OR calculator 402 to the similarity determination unit 404 may encode the exclusive OR of the first data and each of the plurality of data in the data storage area table vol and determine whether the size of the encoded data is smaller than the predetermined threshold value δ. The record unit 405 may select the smallest encoded data among encoded data which is determined to be smaller than the predetermined threshold value δ by the similarity determination unit 404. The record unit 405 may store the selected encoded data and information indicating a position of the second data corresponding to the selected encoded data in association with each other in the difference data storage area table diff.

The exclusive OR calculator 402 to the similarity determination unit 404 may determine whether the size of the encoded data is smaller than the predetermined threshold value δ until a predetermined number of second data which is smaller than the predetermined threshold value δ are found. The record unit 405 may select the smallest encoded data among the predetermined number of encoded data which are determined to be smaller than the predetermined threshold value δ by the similarity determination unit 404. The record unit 405 may store the selected encoded data and information indicating a position of the second data corresponding to the selected encoded data in association with each other in the difference data storage area table diff.

When the similarity determination unit 404 determines that the size of the encoded data is equal to or larger than the predetermined threshold value δ for all the plurality of data in the data storage area table vol, the record unit 405 stores the first data in the data storage area table vol. In this case, the record unit 405 also stores the address included in the write request and information indicating a position of the first data in association with each other in the address index table tmap.

Next, functions of individual units for the method according to the second embodiment in the writing will be described. The method according to the second embodiment utilizes the characteristic described with reference to FIG. 1, that is, the degree of similarity of d and d' is the same as the degree of similarity of d and bit-inverted d' which is data obtained by performing a full-bit inversion on d'. Specifically, it is assumed that the disk 305 is a single level cell (SLC) type flash memory. In the SLC type flash memory, a voltage level for representing bit 1 is different from a voltage level for representing bit 0. Here, the SLC type flash memory refers to a flash memory which writes one bit information indicating whether a stored amount of electrons in a floating gate of one cell is Hi or Low. The bit 1 may be accessed at low power consumption and a low error rate as compared with the bit 0. The method according to the second embodiment will be described in more detail with reference to FIGS. 8 to 11.

When a write request is received, the similarity determination unit 404 determines whether the size of the encoded data obtained by encoding the exclusive OR of the first data and each data of the plurality of data by the run-length encoding is smaller than a predetermined threshold value δ.

When the similarity determination unit 404 determines that all the sizes of individual encoded data are equal to or larger than the predetermined threshold value δ, the record unit 405 determines whether the number of 1's in a binary notation of the first data is smaller than a half of the number of bits in the binary notation of the first data. When the record unit 405 determines that the number of 1's is smaller than a half of the number of bits in the binary notation of the first data, the record unit 405 stores bit-inverted data obtained by a full-bit inversion on the binary notation of the first data in the data storage area table vol. The record unit 405 stores information indicating a position of the bit-inverted data and encoded data, which is obtained by the run-length encoding and indicates that all bits are 1, in association with each other in the difference data storage area table diff.

Next, a process when a read request is received from the server 201 will be described. The user IO controller 401 receives a read request including an address of a read destination.

The storage destination determination unit 406 determines whether data corresponding to the address of the read destination is any one of the plurality of data stored in the data storage area table vol or encoded data stored in the difference data storage area table diff by referring to the address index table tmap. For example, the address index table tmap may store therein a flag indicating whether the data corresponding to the address is stored in the data storage area table vol or the difference data storage area table diff. The storage destination determination unit 406 makes the determination by referring to the flag corresponding to the address of the read destination.

When the storage destination determination unit 406 determines that the data corresponding to the address of the read destination is encoded data, the decoder 407 decodes, by the run-length encoding, the encoded data of the read destination identified by information indicating a position of the encoded data corresponding to the address of the read destination.

The exclusive OR calculator 402 calculates an exclusive OR of the data obtained by decoding the encoded data of the read destination and data stored at the position identified by the position information associated with the encoded data of the read destination. The user IO controller 401 transmits the exclusive OR calculated by the exclusive OR calculator 402 to the server 201 as data of the read destination.

The GC controller 408 deletes an entry of the difference data storage area table diff, which is not referred to by the address index table tmap, from the storage unit 102. Similarly, the GC controller 408 deletes an entry of the data storage area table vol, which is not referred to by the address index table tmap and the difference data storage area table diff, from the storage unit 102. Thus, a data area of the storage unit 102 may be reused.

FIG. 5 is a diagram illustrating an example of stored contents of the storage unit 102. The storage unit 102 has the address index table tmap, the data storage area table vol, and the difference data storage area table diff. The address index table tmap illustrated in FIG. 5 has records 501-1 and 501-2. The data storage area table vol illustrated in FIG. 5 has records 502-1 and 502-2. The difference data storage area table diff illustrated in FIG. 5 has a record 503-1.

Each record of the address index table tmap includes an address field and a reference field. The address received from the server 201 is stored in the address field. In the reference field, a pointer indicating a stored position of the data corresponding to the address received from the server 201 is stored. As illustrated in FIG. 5, the area indicated by the pointer may be an area in the data storage area table vol or an area in the difference data storage area table diff.

The data storage area table vol has a data field. In the data field, data accumulated by the information storage device 101 is stored.

The difference data storage area table diff includes a difference data field and a reference field. In the difference data field, difference data which is a difference from original data stored in the data storage area table vol is stored. The original data is stored at a position indicated by a pointer. The pointer indicating the stored position of the original data is stored in the reference field.

For example, the record 501-1 is a record related to an address "0000" received from the server 201. Specifically, the record 501-1 indicates that the data of the address "0000" is "110100111000" in the record 502-1 indicated by the pointer stored in the reference field of the record 501-1.

The record 501-2 is a record related to an address "0001" received from the server 201. Specifically, the record 501-2 indicates that the data of the address "0001" is a value obtained by an XOR between data obtained by decoding the difference data of the record 503-1 and data of the record 502-1 indicated by the pointer stored in the reference field of the record 503-1. The data obtained by decoding the difference data of the record 503-1 is "000000101110". Therefore, the data of the address "0001" is "110100010110" obtained by an XOR between "000000101110" and "110100111000".

When a specific numerical value illustrated in FIG. 1 is applied, the size of the data stored in the data storage area table vol is 4 KiB and the bit length is 32 K. When a sum of the data stored in the data storage area table vol is 1 TiB, it is regarded that the number of entries of the data storage area table vol is 2^28.

First Embodiment

Next, a data read process and a data write process in according to the first embodiment will be described with reference to FIGS. 6 and 7.

Figure 6:
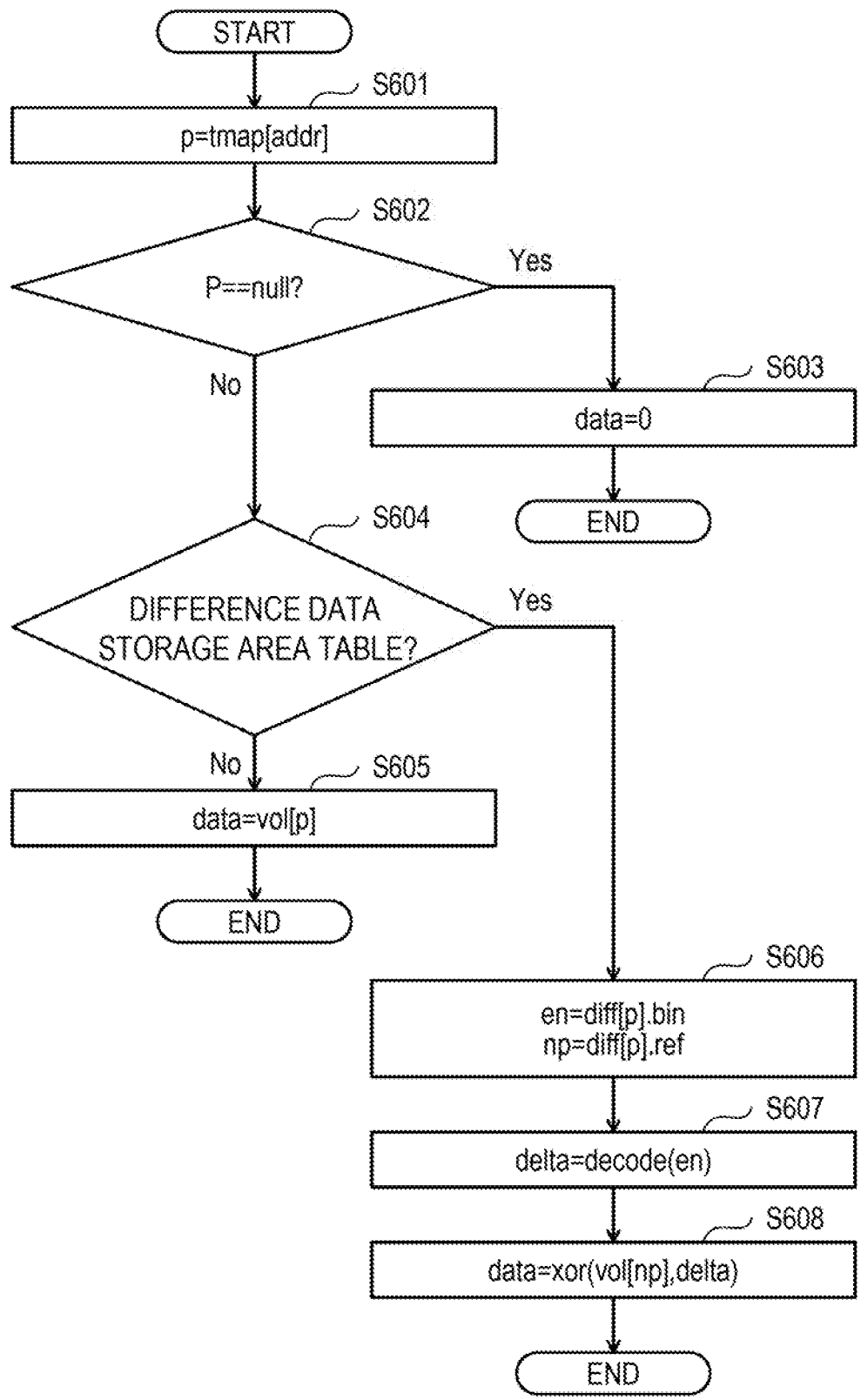
FIG. 6 is a flowchart illustrating an exemplary flow of a data read process according to a first embodiment.

FIG. 6 is a flowchart illustrating an exemplary flow of the data read process according to the first embodiment. In the data read process, an address (denoted by "addr" in the drawings) of the read destination is received as a parameter. A return value of the data read process is stored in a variable "data".

The information storage device 101 assigns a value of the address index table tmap[addr] to a variable "p" (S601). Here, the address index table tmap[addr] indicates an entry of the address index table tmap, in which the value of "addr" is stored in the address field. When an entry having the value of "addr" in the address field is found, a value indicating the position of the entry is stored in the variable "p" and when the value of "addr" is not found, null is stored in the variable "p".

Next, the information storage device 101 determines whether the variable "p" is null (S602). When it is determined that the variable "p" is null (Yes in S602), the information storage device 101 substitutes 0 in the variable "data" (S603). Then, the information storage device 101 ends the data read process.

When it is determined that the variable "p" is not null (No in S602), the information storage device 101 determines whether the variable "p" indicates the inside of the difference data storage area table diff (S604). When it is determined that the variable "p" indicates the inside of the data storage area table vol (No in S604), the information storage device 101 substitutes the value of the data storage area table vol[p] in the variable "data" (S605). Then, the information storage device 101 ends the data read process.

When it is determined that the variable "p" indicates the inside of the difference data storage area table diff (Yes in S604), the information storage device 101 substitutes a value of the difference data storage area table diff[p].bin in a variable "en" and substitutes a value of the difference data storage area table diff[p].ref in a variable "np" (S606). Here, the difference data storage area table diff[p].bin indicates a difference data field of an entry, which is indicated by the variable "p", of the difference data storage area table diff. The difference data storage area table diff[p].ref indicates a reference field of an entry, which is indicated by the variable "p", of the difference data storage area table diff.

Next, the information storage device 101 substitutes a return value of decode(en) in a variable "delta" (S607). Here, the decode( ) is a function for decoding data encoded by the run-length encoding. The information storage device 101 substitutes a return value of xor(data storage area table vol[np], delta) in the variable "data" (S608). Then, the information storage device 101 ends the data read process.

Figure 7:
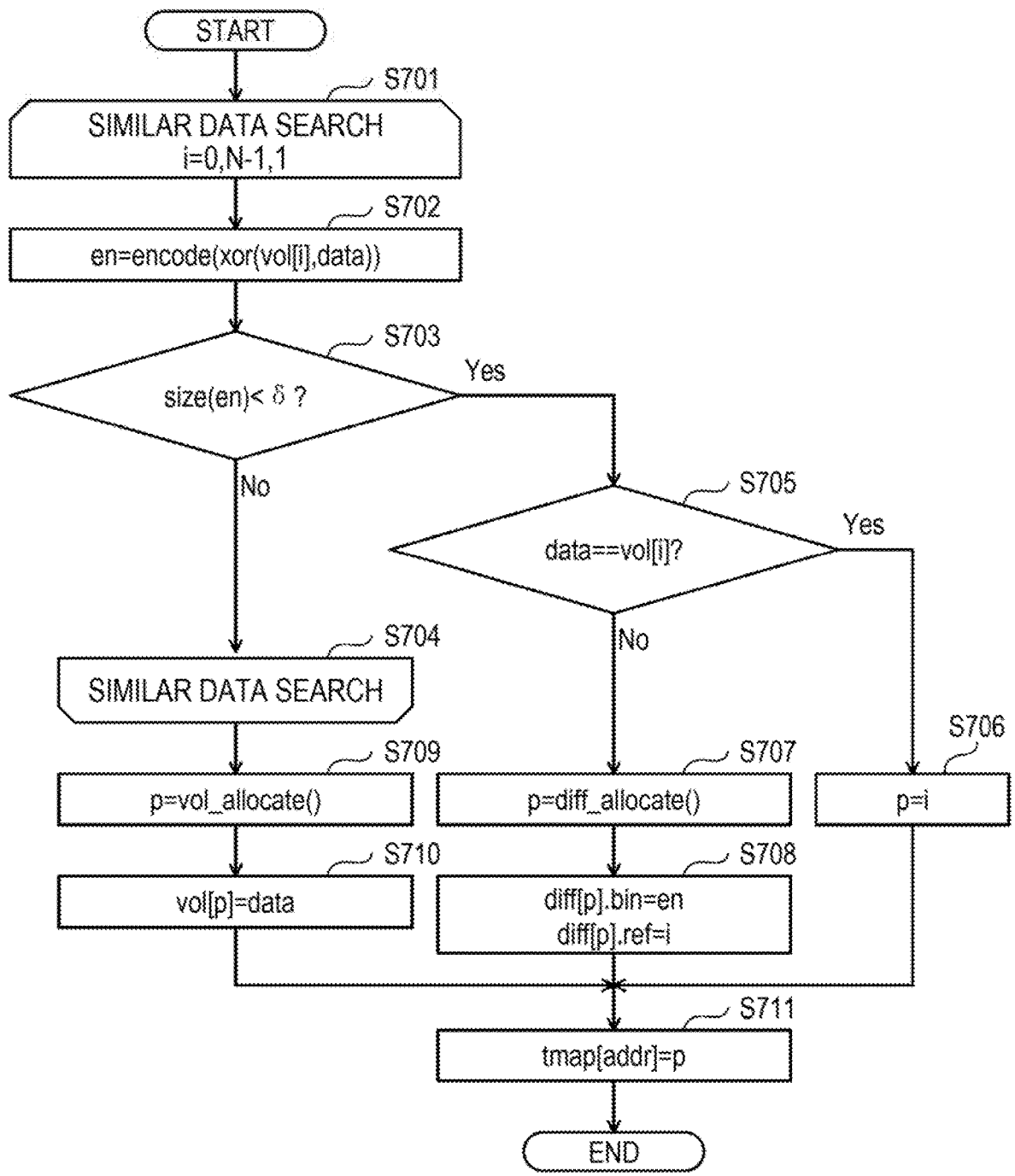
FIG. 7 is a flowchart illustrating an exemplary flow of a data write process according to a first embodiment.

FIG. 7 is a flowchart illustrating an exemplary flow of the data write process according to the first embodiment. In the data write process, an address "addr" of the write destination and written data (denoted by "data" in the drawings) are received as parameters.

The information storage device 101 performs a loop operation of a similar data search for a variable "i" (0 to N−1 with an interval of 1) (S701 to S704). Here, "i=0,N−1,1" described in S701 refers to "variable=initial value, end value, and incremental value". Although a linear search of the data storage area table vol is performed in the loop operation, the search method is not limited to the linear search. In the loop operation, the information storage device 101 substitutes a return value of encode(xor(data storage area table vol[i], data)) in a variable "en" (S702). Here, the encode( ) is a function for encoding data by the run-length encoding.

Next in the loop operation, the information storage device 101 determines whether an output result of size(en) is smaller than a threshold value δ (S703). When it is determined that the output result of size(en) is smaller than the threshold value δ (Yes in S703), that is, when data which is similar to the written data is found, the information storage device 101 exits the loop operation and determines whether the parameter "data" matches the data storage area table vol[i] (S705). In S705, the information storage device 101 may perform the determination by bitwise matching or determine whether the value of the variable "en" is "zeroL". Here, L is the number of bits in a binary notation of data stored in the data storage area table vol[i] or the parameter "data".

When it is determined that the parameter "data" matches the data storage area table vol[i] (Yes in S705), the information storage device 101 substitutes a value of the variable "i" in the variable "p" (S706).

When it is determined that the parameter "data" does not match the data storage area table vol[i] (No in S705), the information storage device 101 substitutes a return value of diff_allocate( ) in the variable "p" (S707). Here, the diff_allocate( ) is a function for returning an index of an empty entry of the difference data storage area table diff.

The information storage device 101 substitutes a value of the variable "en" in the difference data storage area table diff[p].bin and substitutes a value of the variable "i" in the difference data storage area table diff[p].ref (S708).

When it is determined that size(en) is equal to or larger than the threshold value δ (No in S703), the information storage device 101 returns to the beginning of the loop operation of the similar data search (S704). If data for which size(en) is equal to or larger than the threshold value sδ is not found even when the variable "i" is N−1, that is, if data which is similar to the written data is not found, the information storage device 101 ends the loop operation and substitutes a return value of vol_allocate( ) in the variable "p" (S709). Here, the vol_allocate( ) is a function for returning an index of an empty entry of the data storage area table vol. Next, the information storage device 101 substitutes a value of the parameter "data" in the data storage area table vol[p] (S710).

After ending any one of S706, S708, and S710, the information storage device 101 substitutes the value of the variable "p" in the address index table tmap[addr] (S711). Then, the information storage device 101 ends the data write process.

The loop operation of the similar data search is not limited to the example illustrated in FIG. 7. The flowchart illustrated in FIG. 7 illustrates a method for selecting similar data which is initially found, that is, a so-called first-fit method. As another example, the information storage device 101 may employ a method for selecting similar data for which size(en) is the smallest among data for which size(en) is smaller than the threshold value δ, that is, a so called best-fit method. When the first-fit method and the best-fit method are compared, the first-fit method may perform the data write process for a short time as compared with the best-fit method. Meanwhile, according to the best-fit method, an amount of data stored in the storage unit 102 may be restricted as compared with the first-fit method, so that the usage efficiency of the storage may be improved.

The information storage device 101 may employ a method in which data for which size(en) is the smallest is selected, among similar data for which size(en) is smaller than the threshold value δ, when the number of the similar data reaches a predetermined maximum number of candidate data. Further, the information storage device 101 may employ a method in which a timer is set at the time of starting the loop operation and data for which size(en) is the smallest is selected among similar data for which size(en) is smaller than the threshold value δ and which has been found until time-out is notified. These two methods may have an intermediate performance between the first-fit method and the best-fit method in terms of a processing time and an amount of data stored in the storage unit 102.

Second Embodiment

Next, a data read process and a data write process according to the second embodiment will be described with reference to FIGS. 8 to 11. First, there is a property that a degree of similarity between d and d' in the embodiments is equal to a degree of similarity between d and bit-inverted d' which is data obtained by performing a full-bit inversion on d'. The property will be described with reference to FIG. 8. In some cases, it may be more efficient to determine that the degree of similarity between d and bit-inverted d' is high, instead of the degree of similarity between d and d'. Specifically, it is assumed that the disk 305 is an SLC type flash memory. In the SLC type flash memory, a voltage level for representing bit 1 is different from a voltage level for representing bit 0. The bit 1 may be accessed at low power consumption and a low error rate as compared with the bit 0.

Therefore, according to the second embodiment, a method is performed in which lower cost data, between d' and bit-inverted d', is stored in the data storage area table vol. Specifically, the information storage device 101 stores data having more 1's, between d' and bit-inverted d', in the data storage area table vol.

Figure 8:
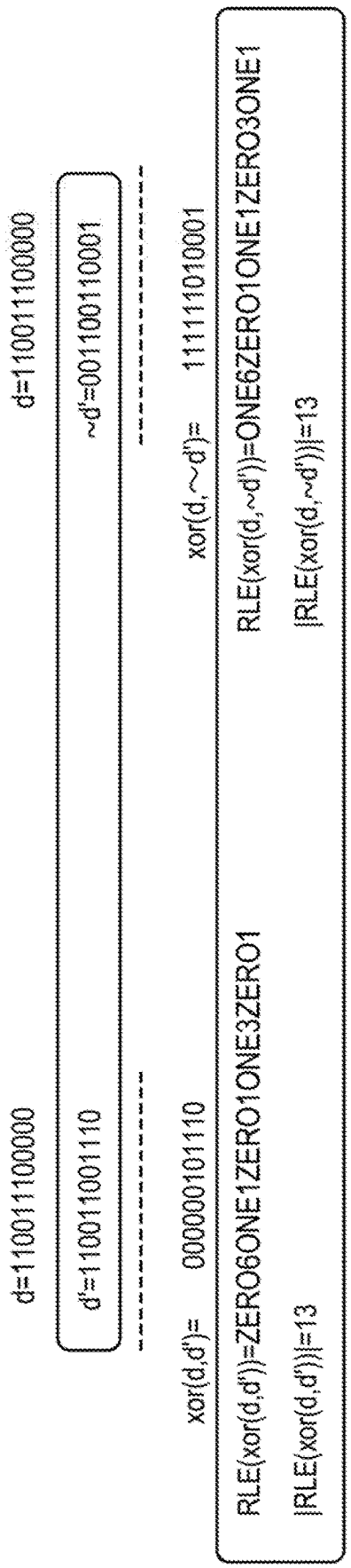
FIG. 8 is a diagram illustrating a degree of similarity after a full-bit inversion.

FIG. 8 is a diagram illustrating a degree of similarity after a full-bit inversion. An example of FIG. 8 illustrates a property in which the degree of similarity between d and d' is identical to the degree of similarity between d and bit-inverted d'. The value of d illustrated in FIG. 8 is "110011100000". In FIG. 8, a full-bit inversion is represented by "~". The value of d' is "110011001110". Therefore, bit-inverted d' (~d') is "001100110001". Output results of xor(d, d'), xor(d, ~d'), RLE(xor(d, d')), RLE(xor(d, ~d')), |RLE(xor(d, d'))|, |RLE(xor(d, d'))| will be listed below.

xor(d,d')=000000101110 xor(d,~d')=111111010001

RLE(xor(d,d'))=zero6one1zero1one3zero1

RLE(xor(d,~d'))=one6zero1one1zero3one1

|RLE(xor(d,d'))|=13

|RLE(xor(d,~d'))|=13

As described above, it is understood that the degree of similarity between d and d' is identical to the degree of similarity between d and ~d'. Next, the data write process according to the second embodiment will be described with reference to FIGS. 9 to 11. The data read process according to the second embodiment is similar to the data read process according to the first embodiment, so that descriptions thereof will be omitted.

Figure 9:
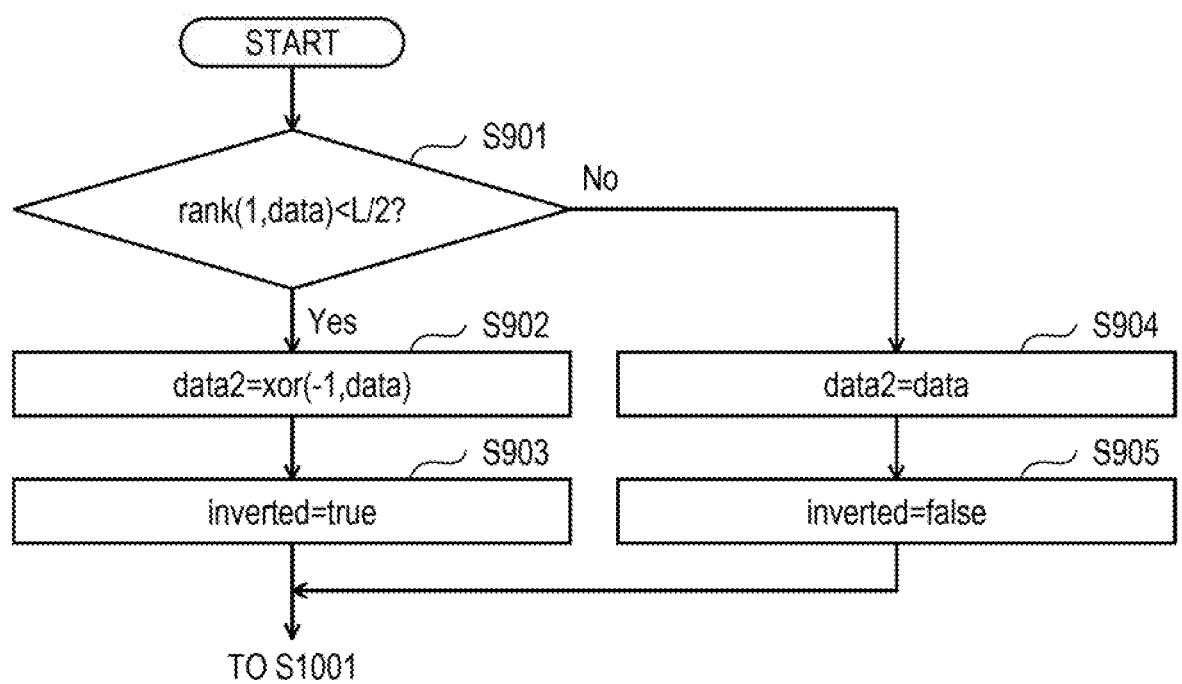
FIG. 9 is a flowchart illustrating an exemplary flow of a data write process according to a second embodiment.
Figure 10:
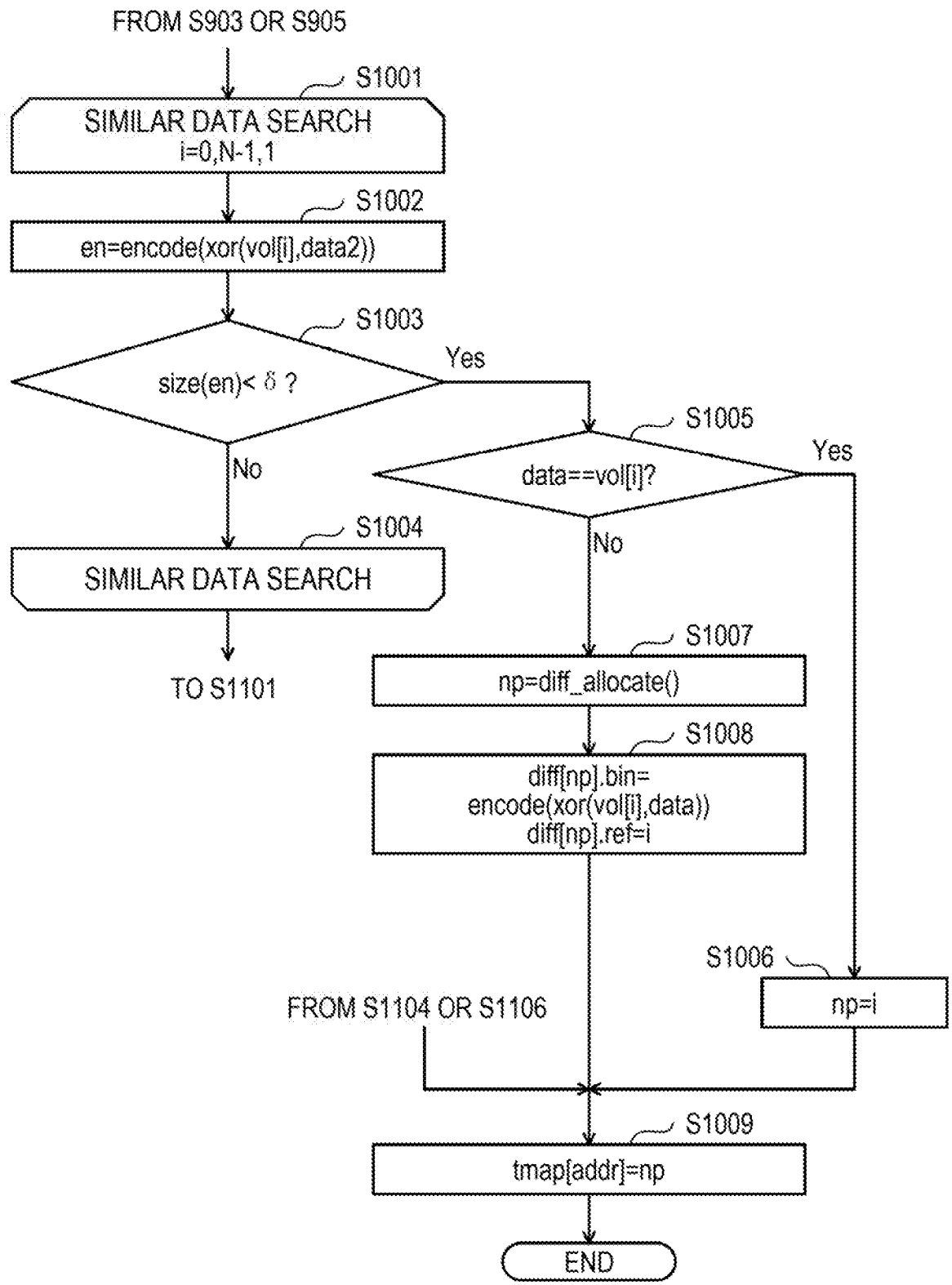
FIG. 10 is a flowchart illustrating an exemplary flow of a data write process according to a second embodiment.
Figure 11:
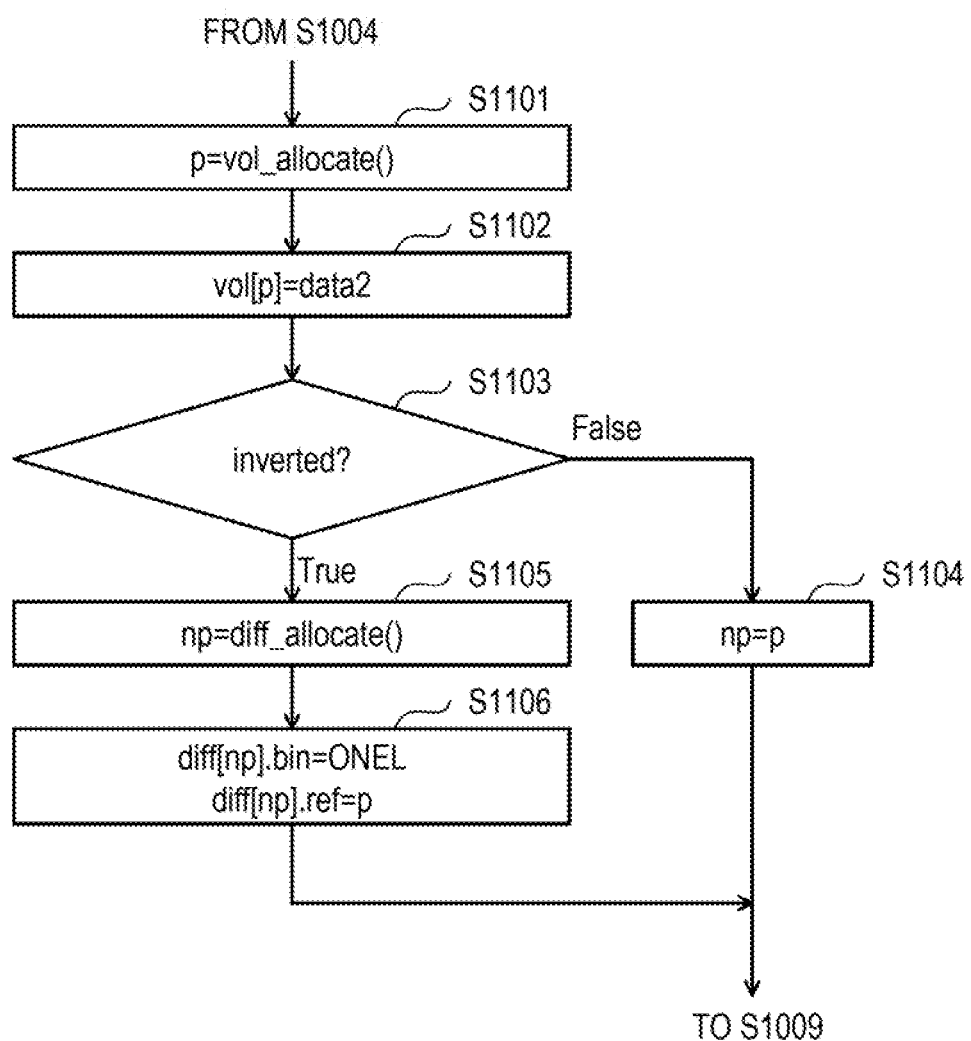
FIG. 11 is a flowchart illustrating an exemplary flow of a data write process according to a second embodiment.

FIGS. 9 to 11 are flowcharts illustrating an exemplary flow of the data write process according to the second embodiment. In the data write process, an address "addr" of the write destination and written data (denoted by "data" in the drawings) are received as parameters.

The information storage device 101 determines whether rank(1, data) is smaller than L/2 (S901). Here, the rank(1, data) is a function for counting the number of 1's in a binary expression of the parameter "data". The function for counting the number of 1's in the bit length is also referred to as population count.

When it is determined that rank(1, data) is smaller than L/2 (Yes in S901), since more 0's are included in the parameter "data" than 1's, the information storage device 101 substitutes a return value of xor(−1,data) in a variable "data2" (S902). Here, the xor(−1,data) is an overall full-bit inversion operation on the parameter "data". The information storage device 101 substitutes "true" in a variable "inverted" (S903).

When it is determined that rank(1, data) is equal to or larger than L/2 (No in S901), since the number of 1's included in the parameter "data" is equal to or more than the number of 0's included in the parameter "data", the information storage device 101 substitutes a value of the parameter "data" in the variable "data2" (S904). The information storage device 101 substitutes "false" in the variable "inverted" (S905).

After ending S903 or S905, the information storage device 101 performs a loop operation of a similar data search on a variable "i" (0 to N−1 with an interval of 1) (S1001 to S1004). In the loop operation, the information storage device 101 substitutes a return value of encode(xor(data storage area table vol[i], data2)) in a variable "en" (S1002).

Next in the loop operation, the information storage device 101 determines whether an output result of size(en) is smaller than a threshold value δ (S1003). When it is determined that the output result of size(en) is smaller than the threshold value δ (Yes in S1003), that is, when data which is similar to the written data is found, the information storage device 101 exits the loop operation and determines whether the parameter "data" matches the data storage area table vol[i] (S1005). Here, the information storage device 101 may calculate a truth-value of (not inverted AND en==zeroL) or calculate a truth value of (inverted AND en==oneL), instead of S1005.

When it is determined that the parameter "data" matches the data storage area table vol[i] (Yes in S1005), the information storage device 101 substitutes a value of the variable "i" in a variable "np" (S1006).

When it is determined that the parameter "data" does not match the data storage area table vol[i] (No in S1005), the information storage device 101 substitutes a return value of diff_allocate( ) in the variable "np" (S1007). The information storage device 101 substitutes a return value of encode (xor(data storage area table vol[i], data)) in the difference data storage area table diff[np].bin and substitutes a value of the variable "i" in the difference data storage area table diff[np].ref (S1008).

After ending S1006 or S1008, the information storage device 101 substitutes the value of variable "np" in the address index table tmap[addr] (S1009). After ending S1104 or S1106 illustrated in FIG. 11, the information storage device 101 also substitutes the value of variable "np" in the address index table tmap[addr] (S1009)

When it is determined that the output result of size(en) is equal to or larger than the threshold value δ (No in S1003), the information storage device 101 returns to the beginning of the loop operation of the similar data search (S1004). If data for which size(en) is equal to or larger than the threshold value δ is not found even when the variable "i" is N−1, that is, if data which is similar to the written data is not found, the information storage device 101 ends the loop operation and substitutes a return value of vol_allocate( ) in the variable "p" (S1101). Next, the information storage device 101 substitutes a value of the variable "data2" in the data storage area table vol[p] (S1102).

Next, the information storage device 101 checks whether a value of the variable "inverted" is "true" or "false" (S1103). When it is determined that the value of the variable "inverted" is "false" (False in S1103), the information storage device 101 substitutes the value of the variable "p" in variable "np" (S1104).

When it is determined that the value of the variable "inverted" is "true" (True in S1103), the information storage device 101 substitutes a return value of diff_allocate( ) in the variable "np" (S1105). Further, the information storage device 101 substitutes "oneL" in the difference data storage area table diff[np].bin and substitutes the value of the variable "p" in the difference data storage area table diff [np].ref (S1106). After ending any one of S1104 and S1106, the information storage device 101 performs S1009.

In the data write process according to the second embodiment, the information storage device 101 stores lower cost data in the data storage area table vol. Therefore, for example, when there is a plurality of disks 305 and the plurality of disks 305 includes the SLC type flash memories, the second embodiment may be applied. Specifically, the SLC type flash memories among the plurality of disks 305 may store therein at least the data storage area table vol. Magnetic disks, which are the remaining of the plurality of disks 305, may store therein the address index table tmap and the difference data storage area table diff.

As described above, when the size of encoded data obtained by the run-length encoding on an exclusive OR of already stored data d and new data d' included in a write request received from the server 201 is smaller than δ, the information storage device 101 stores position information of d in association with the encoded data. Thus, since the size of the encoded data indicating the size of the difference is obtained at a high speed, the information storage device 101 may perform deduplication of similar data at a high speed.

When the size of the encoded data is smaller than δ, the information storage device 101 also stores, in the address index table tmap, information indicating the position of the encoded data in association with an address included in the write request. Thus, when a read request is received from the server 201 for an address for which the write request has been made, the information storage device 101 may return data included in the write request by referring to the address index table tmap.

When data corresponding to the address included in the read request is stored in the difference data storage area table diff, the information storage device 101 may generate data corresponding to the address by an exclusive OR of data obtained by decoding difference data stored in the difference data storage area table diff and data stored in the data storage area table vol. Thus, the information storage device 101 may deal with a read request for data which is stored in the difference data storage area table diff.

In a case where the disk 305 is an SLC type flash memory, if the number of 1's included in a binary notation of data to be stored is smaller than a half of the number of bits in the binary notation when the data is stored in the data storage area table vol, the information storage device 101 writes bit-inverted data of the binary notation in the data storage area table vol. Thus, the information storage device 101 may be accessible to the SLC type flash memory at low power consumption and a low error rate.

The method for deduplication according to the embodiments may be performed by a computer such as a personal computer or a workstation by executing a program prepared in advance. The program for deduplication may be stored in a computer-readable recording medium such as a hard disk, a flexible disk, a compact disk-read only memory (CD-ROM), or a digital versatile disk (DVD) and is read from the recording medium by the computer to be executed. The deduplication program may be distributed via a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An information storage device, comprising:
a memory configured to store therein a plurality of data; and
a processor coupled to the memory and configured to:
receive a write request of writing a first data to the memory;
perform an exclusive OR operation on the first data and a second data of the plurality of data to obtain first difference data;
encode the first difference data by a run-length encoding to obtain first encoded data;
determine whether a first size of the first encoded data is smaller than a predetermined threshold value;
when it is determined that the first size of the first encoded data is equal to or larger than the predetermined threshold value,
perform the exclusive OR operation on the first data and one of the plurality of data different from the second data to obtain second difference data;
encode the second difference data by the run-length encoding to obtain second encoded data;
determine whether a second size of the second encoded data is smaller than the predetermined threshold value, and
when it is determined that the second size of the second encoded data is smaller than the predetermined threshold value, store the second encoded data in the memory in association with first position information indicating a position of the second data that serves as duplicated data of the first data, and
when it is determined that the first size of the first encoded data is smaller than the predetermined threshold value, store the first encoded data in the memory in association with the first position information indicating the position of the second data in order to remove the second data of the plurality of data stored in the memory that serves as the duplicated data of the first data.

2. The information storage device according to claim 1, wherein
the write request includes the first data and a first address of a write destination in which the first data is to be written, and
the processor is configured to:
store, upon determining that the first size of the first encoded data is smaller than the predetermined threshold value, the first address in the memory in association with second position information indicating a position of the first encoded data.

3. The information storage device according to claim 2, wherein
the processor is configured to:
receive a read request of reading data, the read request including the first address;
determine, on basis of information stored in the memory, whether data corresponding to the first address is one of the plurality of data and the first encoded data;
obtain, upon determining that data corresponding to the first address is the first encoded data, position information associated with the first address in the memory;
decode the first encoded data stored in a position indicated by the obtained position information to obtain decoded data;
perform the exclusive OR operation on the decoded data and data stored in a position indicated by position information stored in the position indicated by the obtained position information to obtain return data; and
transmit the return data in response to the read request.

4. The information storage device according to claim 1, wherein
the processor is configured to:
perform the exclusive OR operation on the first data and each of the plurality of data to obtain each difference data;
encode each difference data by the run-length encoding to obtain each encoded data;

determine whether each size of each encoded data is smaller than the predetermined threshold value; and determine, upon determining that each size is equal to or larger than the predetermined threshold value for all of the plurality of data, whether a number of in a binary notation of the first data is smaller than a half of a number of bits in the binary notation of the first data;

perform, upon determining that the number of 1's in the binary notation is smaller than a half of the number of bits in the binary notation of the first data, bit inversion on every bit of the binary notation of the first data to obtain a first bit-inverted data;

store the first bit-inverted data in the memory; and store full-bit data in the memory in association with third position information, the full-bit data being encoded data obtained by encoding a first binary data by the run-length encoding, the first binary data being a bit string of 1's, the third position information indicating a position of the first bit-inverted data.

5. A method for removing duplicated data, the method comprising:

receiving, by a computer, a write request of writing first data to a memory storing therein a plurality of data;

performing an exclusive OR operation on the first data and second data of the plurality of data to obtain first difference data;

encoding the first difference data by a run-length encoding to obtain first encoded data;

determining whether a first size of the first encoded data is smaller than a predetermined threshold value;

when it is determined that the first size of the first encoded data is equal to or larger than the predetermined threshold value, performing the exclusive OR operation on the first data and one of the plurality of data different from the second data to obtain second difference data;

encoding the second difference data by the run-length encoding to obtain second encoded data;

determining whether a second size of the encoded data is smaller than the predetermined threshold value, and when it is determined that the second size of the second encoded data is smaller than the predetermined threshold value, store the second encoded data in the memory in association with first position information indicating a position of the second data that serves as duplicated data of the first data; and when it is determined that the first size of the first encoded data is smaller than the predetermined threshold value, storing the first encoded data in the memory in association with the first position information indicating the position of the second data in order to remove the second data of the plurality of data stored in the memory that serves as the duplicated data of the first data.

6. A non-transitory computer-readable recording medium having stored therein a program that causes a computer to execute a process, the process comprising:

receiving a write request of writing first data to a memory storing therein a plurality of data;

performing an exclusive OR operation on the first data and second data of the plurality of data to obtain first difference data;

encoding the first difference data by a run-length encoding to obtain first encoded data;

determining whether a first size of the first encoded data is smaller than a predetermined threshold value;

when it is determined that the first size of the first encoded data is equal to or larger than the predetermined threshold value, performing the exclusive OR operation on the first data and one of the plurality of data different from the second data to obtain second difference data;

encoding the second difference data by the run-length encoding to obtain second encoded data;

determining whether a second size of the second encoded data is smaller than the predetermined threshold value, and when it is determined that the second size of the second encoded data is smaller than the predetermined threshold value, storing the second encoded data in the memory in association with first position information indicating a position of the second data that serves as duplicated data of the first data, and when it is determined that the first size of the first encoded data is smaller than the predetermined threshold value, storing the first encoded data in the memory in association with the first position information indicating the position of the second data in order to remove the second data of the plurality of data stored in the memory that serves as the duplicated data of the first data.

* * * * *